(12) United States Patent
Hsiung et al.

(10) Patent No.: US 12,310,083 B2
(45) Date of Patent: May 20, 2025

(54) SEMICONDUCTOR DEVICE AND METHOD FOR FORMING THE SAME

(71) Applicant: UNITED MICROELECTRONICS CORP., Hsin-Chu (TW)

(72) Inventors: Chang-Po Hsiung, Hsinchu (TW); Ching-Chung Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 353 days.

(21) Appl. No.: 17/540,249

(22) Filed: Dec. 2, 2021

(65) Prior Publication Data
US 2023/0140347 A1 May 4, 2023

(30) Foreign Application Priority Data

Oct. 28, 2021 (CN) .......................... 202111260667.1

(51) Int. Cl.
| | |
|---|---|
| *H01L 29/423* | (2006.01) |
| *H01L 21/02* | (2006.01) |
| *H01L 21/28* | (2006.01) |
| *H10D 30/01* | (2025.01) |
| *H10D 30/60* | (2025.01) |
| *H10D 64/01* | (2025.01) |
| *H10D 64/27* | (2025.01) |

(52) U.S. Cl.
CPC ..... *H10D 64/513* (2025.01); *H01L 21/02236* (2013.01); *H01L 21/28211* (2013.01); *H10D 30/022* (2025.01); *H10D 30/601* (2025.01); *H10D 64/017* (2025.01)

(58) Field of Classification Search
None
See application file for complete search history.

(56) References Cited

U.S. PATENT DOCUMENTS

| | | | |
|---|---|---|---|
| 9,431,239 B1 | 8/2016 | Lee | |
| 9,716,139 B2 | 7/2017 | Chen | |
| 9,972,539 B2 | 5/2018 | Li | |
| 10,388,758 B2 | 8/2019 | Liao | |
| 10,600,908 B2 | 3/2020 | Huang | |
| 2007/0029619 A1* | 2/2007 | Kim | H01L 29/78 257/E21.429 |
| 2011/0260242 A1* | 10/2011 | Jang | H01L 29/4966 438/270 |
| 2015/0214313 A1* | 7/2015 | Oh | H01L 29/66666 438/270 |
| 2020/0381548 A1* | 12/2020 | Lu | H01L 29/66659 |

* cited by examiner

*Primary Examiner* — William C Trapanese
(74) *Attorney, Agent, or Firm* — Winston Hsu

(57) ABSTRACT

A semiconductor device is disclosed. The semiconductor device includes a substrate, an active region in the substrate, a recessed region in the active region, a gate dielectric layer on the recessed region, a gate structure on the gate dielectric layer, and a source/drain region in the active region and at a side of the gate structure. An edge portion of the gate dielectric layer comprises a rounded profile, and the source/drain region directly contacts the edge portion of the gate dielectric layer.

20 Claims, 12 Drawing Sheets

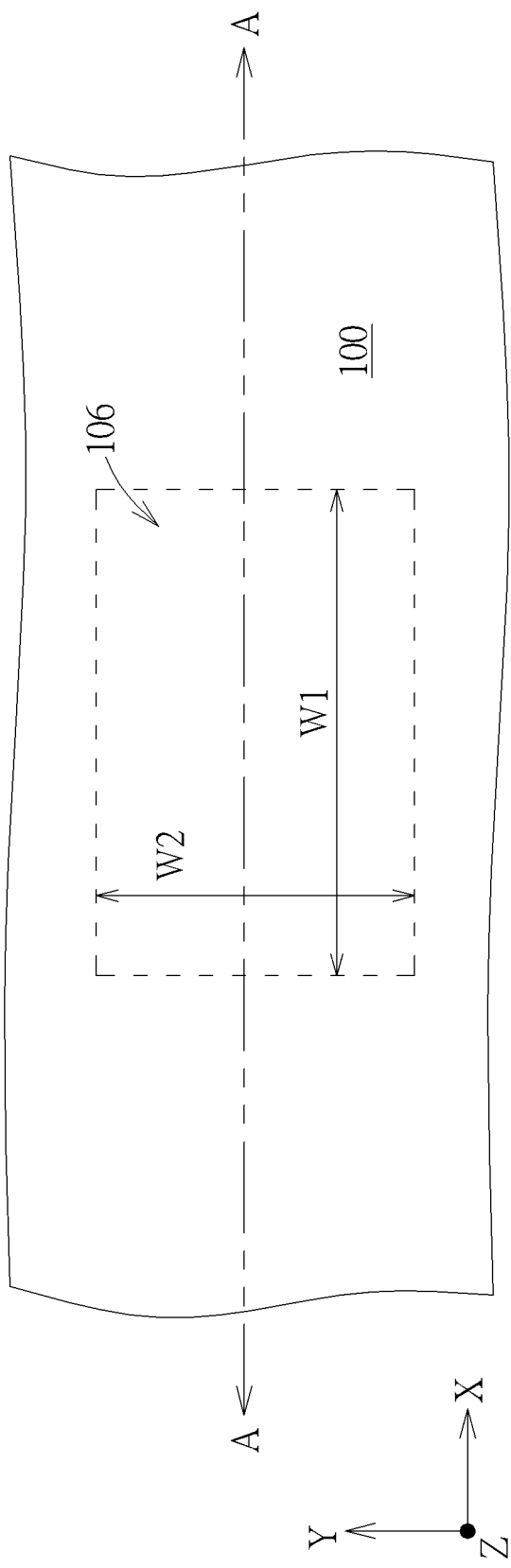
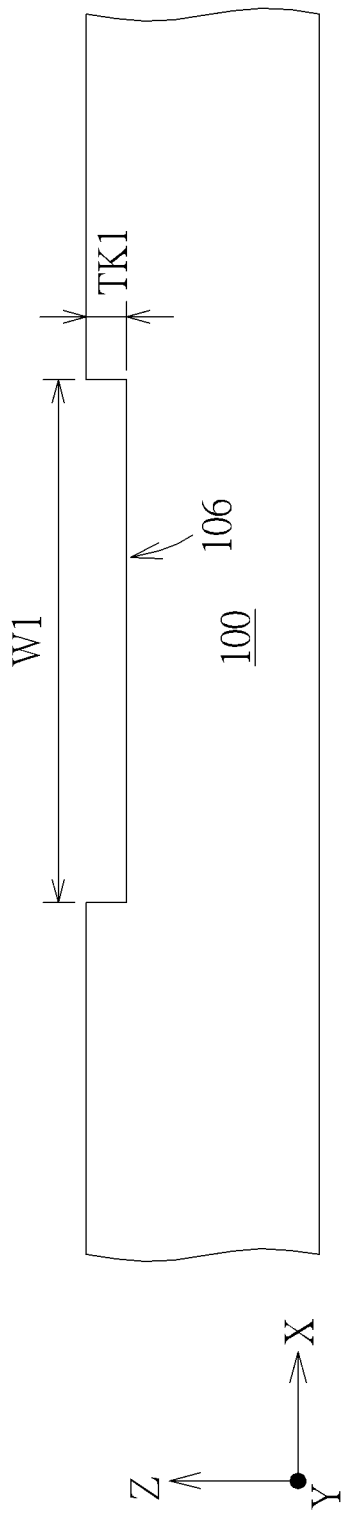
FIG. 1A
FIG. 1B

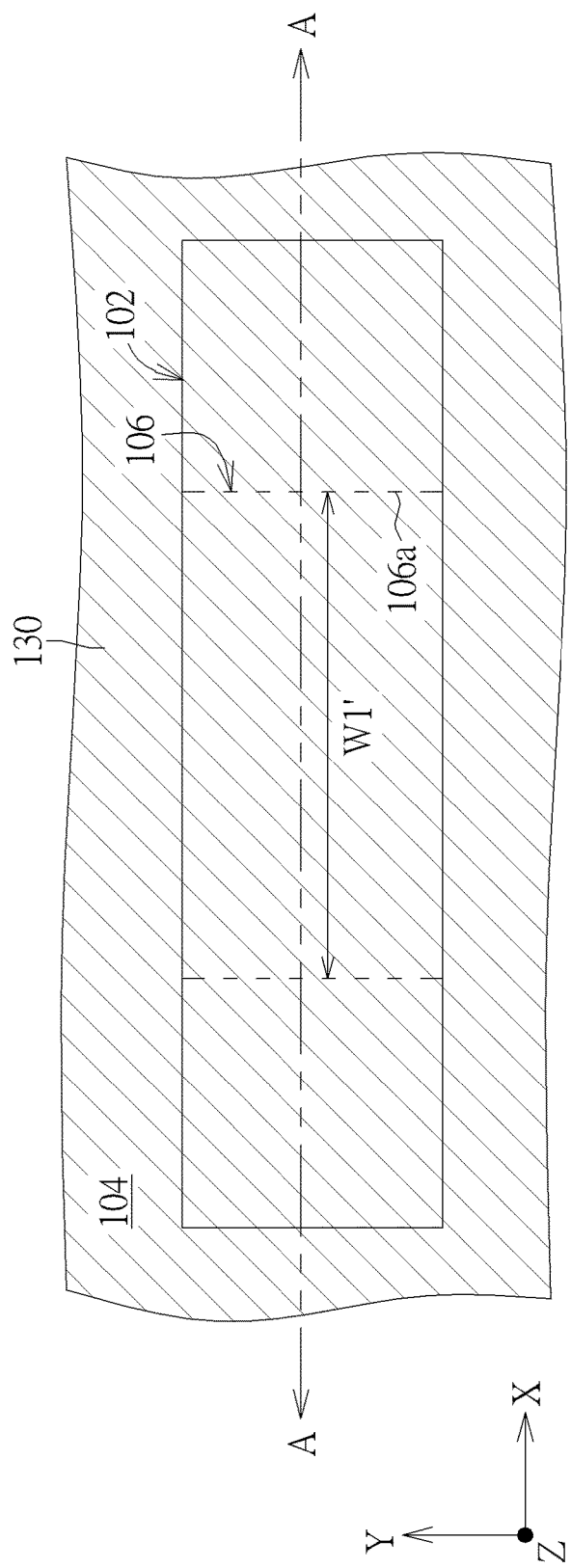
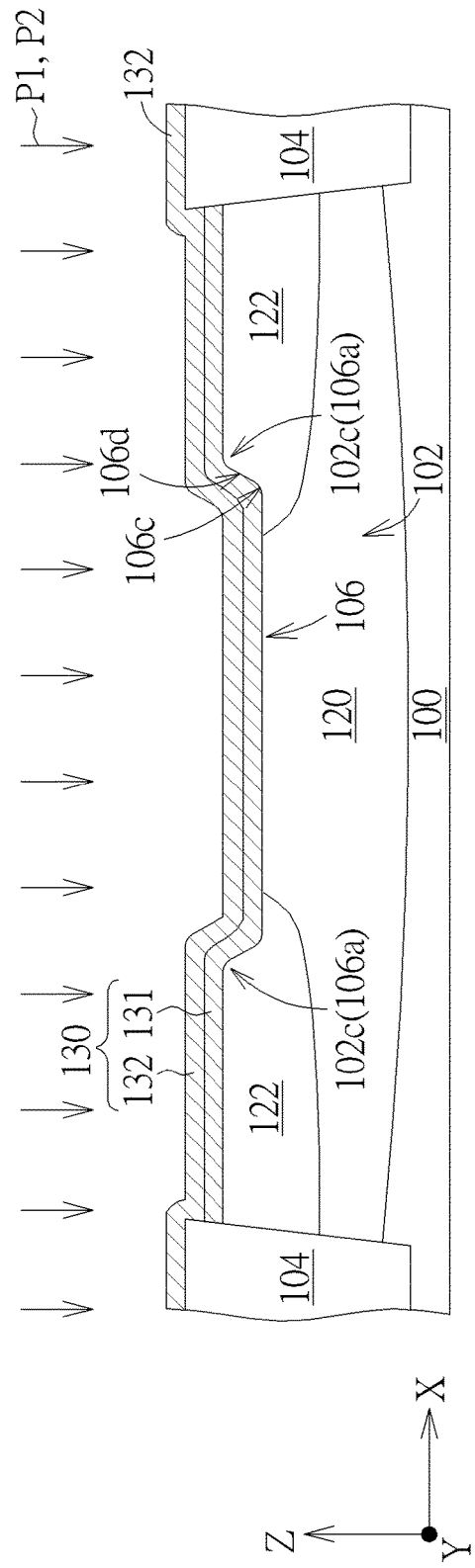
FIG. 4A
FIG. 4B

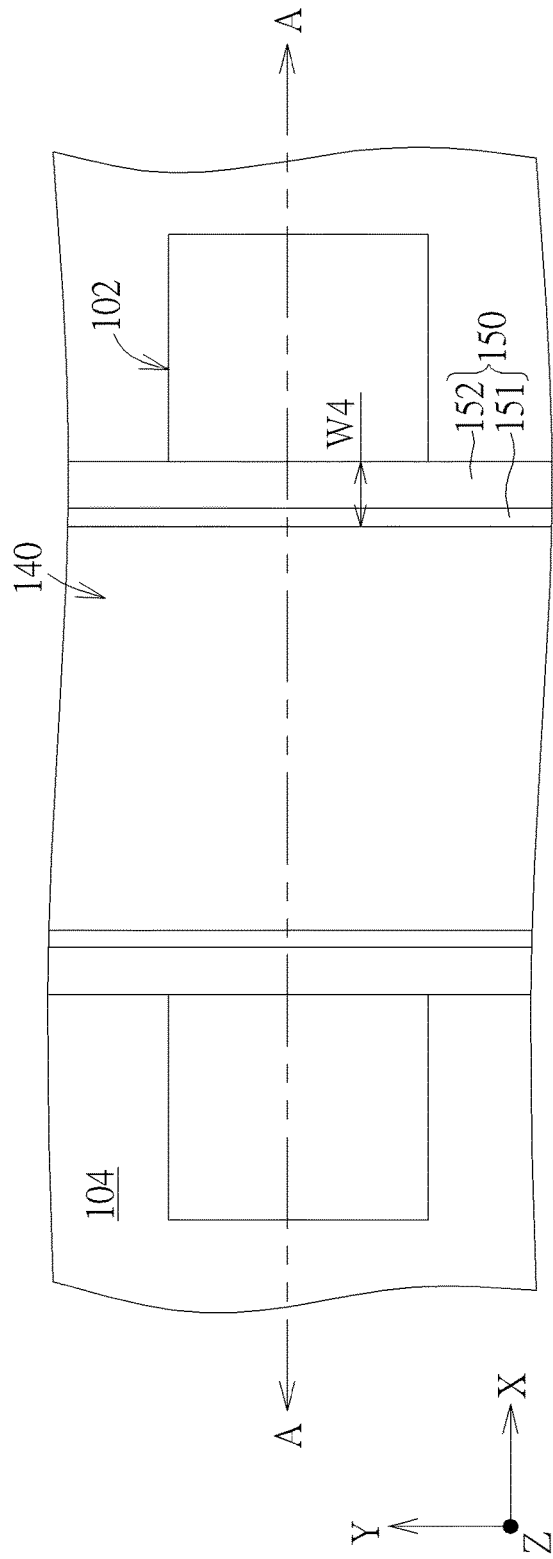
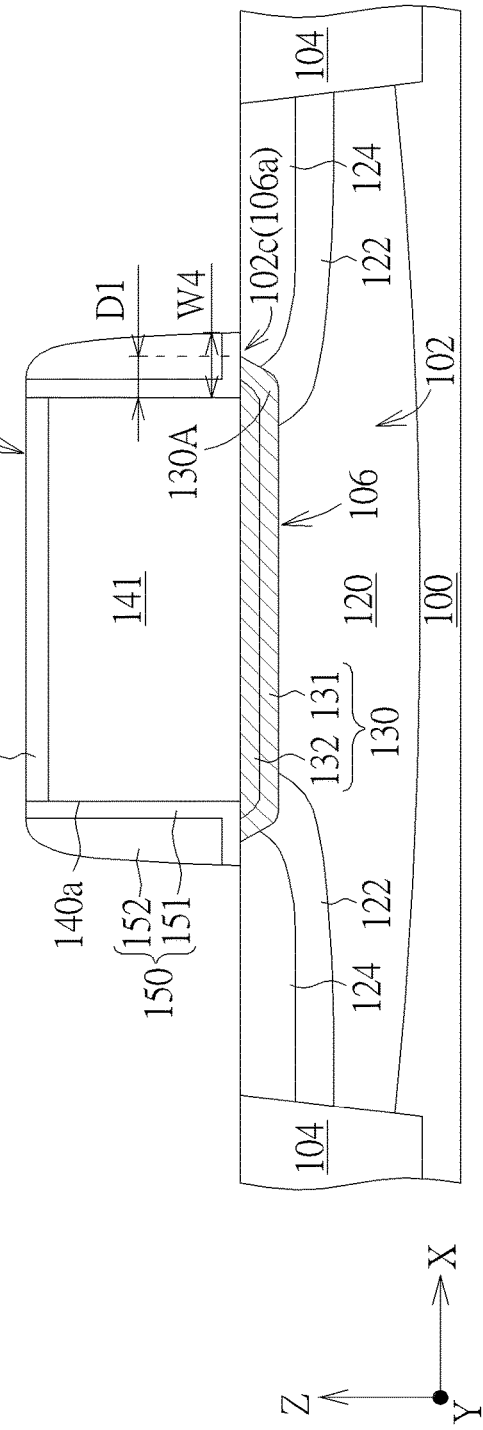
FIG. 6A
FIG. 6B

SEMICONDUCTOR DEVICE AND METHOD FOR FORMING THE SAME

BACKGROUND OF THE INVENTION

1. Field of the Invention

The present invention generally relates to a semiconductor device and a method for forming the same. More particularly, the present invention relates to a semiconductor device with a recessed channel and a method for forming the same.

2. Description of the Prior Art

Metal-oxide-semiconductor field-effect transistor (MOSFET) devices are semiconductor devices that are widely used in analog and digital circuits. Typically, the operation of a MOSFET device includes applying a gate bias on the metal-oxide-semiconductor capacitor to attract carriers (such as electrons) accumulating at the interface between the semiconductor layer and the oxide layer (or a gate dielectric layer), thereby forming a current channel that may conduct current between the source region and the drain region of the MOSFET device. The current channel of the MOSFET device may be turned on or turned off by controlling the gate bias.

As the semiconductor technology continues to progress, the feature sizes of the MOSFET devices have become smaller to increase the device density of the integrated circuits. However, miniaturization of the MOSFET devices may make the short channel effect (SCE) more and more significant. In some cases, the gate induced drain leakage (GIDL) and hot carrier injection (HCI) caused by the short channel effects may seriously affect the performance and reliability of the MOSFET devices.

SUMMARY OF THE INVENTION

The present invention is directed to provide a semiconductor device with a recessed channel and a method for forming the same. The recessed channel of the semiconductor device may reduce the strength of the electric field between the source/drain region and the gate dielectric layer, and therefore the GIDL and the HCI of the semiconductor device may be reduced and consequently the device performance may be improved.

In an embodiment of the present invention, a semiconductor device is disclosed. The semiconductor device includes a substrate, an active region in the substrate, a recessed region in the active region, a gate dielectric layer on the recessed region, a gate structure on the gate dielectric layer, and a source/drain region in the active region and at a side of the gate structure. An edge portion of the gate dielectric layer comprises a rounded profile, and the source/drain region directly contacts the edge portion of the gate dielectric layer.

In another embodiment of the present invention, a method for forming a semiconductor device is disclosed. The method includes the steps of providing a substrate, forming an active region in the substrate and a recessed region in the active region, performing an oxidation process to form a gate dielectric layer on the recessed region, wherein an edge portion of the gate dielectric layer comprises a rounded profile. The method further includes the steps of forming a gate structure on the gate dielectric layer, and forming a source/drain region in the active region and at a side of the gate structure, wherein the source/drain region directly contacts the edge portion of the gate dielectric layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are schematic drawings and included to provide a further understanding of the embodiments, and are incorporated in and constitute a part of this specification. The drawings illustrate some of the embodiments and, together with the description, serve to explain their principles. Relative dimensions and proportions of parts of the drawings have been shown exaggerated or reduced in size and are not necessarily drawn to scale, for the sake of clarity and convenience in the drawings. The same reference signs are generally used to refer to corresponding or similar features in modified and different embodiments.

FIG. 1A, FIG. 1B, FIG. 2A, FIG. 2B, FIG. 3A, FIG. 3B, FIG. 4A, FIG. 4B, FIG. 5A, FIG. 5B, FIG. 6A, FIG. 6B, FIG. 7 and FIG. 8 are schematic diagrams illustrating a method for forming a semiconductor device according to a first embodiment of the present invention, wherein:

FIG. 1A is a plan view of the semiconductor device after forming a recessed region in a substrate, and FIG. 1B is a cross-sectional view taken along the line AA shown in FIG. 1A;

FIG. 2A is a plan view of the semiconductor device after forming a shallow trench isolation structure and an active region in the substrate, and FIG. 2B is a cross-sectional view taken along the line AA shown in FIG. 2A;

FIG. 3A is a plan view of the semiconductor device after forming a well region and a lightly-doped region in the substrate, and FIG. 3B is a cross-sectional view taken along the line AA shown in FIG. 3A;

FIG. 4A is a plan view of the semiconductor device after forming a gate dielectric layer on the substrate, and FIG. 4B is a cross-sectional view taken along the line AA shown in FIG. 4A;

FIG. 5A is a plan view of the semiconductor device after forming a gate structure on the substrate, and FIG. 5B is a cross-sectional view taken along the line AA shown in FIG. 5A;

FIG. 6A is a plan view of the semiconductor device after forming spacers on sidewalls of the gate structure and source/drain regions in the substrate, and FIG. 6B is a cross-sectional view taken along the line AA shown in FIG. 6A;

FIG. 7 is a cross-sectional view of the semiconductor device after forming a metal gate structure and contact plugs on the substrate; and FIG. 8 is a partial enlarged cross-sectional view of the semiconductor device shown in FIG. 7.

FIG. 12 and FIG. 13 are schematic diagrams illustrating a method for forming a semiconductor device according to a fifth embodiment of the present invention, wherein:

FIG. 12 is a cross-sectional view of the semiconductor device after forming a gate structure on the substrate; and FIG. 13 is a cross-sectional view of the semiconductor device after forming a metal gate structure and contact plugs on the substrate.

DETAILED DESCRIPTION

To provide a better understanding of the present invention to those of ordinary skill in the art, several exemplary embodiments of the present invention will be detailed as follows, with reference to the accompanying drawings using numbered elements to elaborate the contents and effects to be achieved. These embodiments are described in sufficient detail to enable those skilled in the art to practice the invention. Other embodiments may be utilized and that structural, logical and electrical changes may be made without departing from the spirit and scope of the present invention.

FIG. 1A, FIG. 1B, FIG. 2A, FIG. 2B, FIG. 3A, FIG. 3B, FIG. 4A, FIG. 4B, FIG. 5A, FIG. 5B, FIG. 6A, FIG. 6B, FIG. 7 and FIG. 8 are schematic diagrams illustrating a method for forming a semiconductor device according to a first embodiment of the present invention. FIG. 1A, FIG. 2A, FIG. 3A, FIG. 4A, FIG. 5A and FIG. 6A are plan views of the semiconductor device in a plane along the X direction and the Y direction. FIG. 1B, FIG. 2B, FIG. 3B, FIG. 4B, FIG. 5B and FIG. 6B are cross-sectional views of the semiconductor device taken along the line AA in the corresponding plan views and in a plane along the X direction and the Z direction. FIG. 8 is a partial enlarged view of the semiconductor device shown in FIG. 7.

Please refer to FIG. 1A and FIG. 1B. A substrate 100 is provided. The substrate 100 may be a silicon substrate, an epitaxial silicon substrate, a silicon germanium (SiGe) semiconductor substrate, a silicon carbide (SiC) substrate, or a silicon-on-insulator (SOI) substrate, but is not limited thereto. The substrate 100 may include dopants to have a conductivity type, such as P-type conductivity type. A patterning process (such as a photolithography-etching process) is performed to remove a portion of the substrate 100 thereby forming a recessed region 106 in the substrate 100. The recessed region 106 may have a width W1 in the X direction, a width W2 in the Y direction, and a depth TK1 in the Z direction (the depth below the surface of the substrate 100). According to an embodiment of the present invention, the depth TK1 may be between about 200 Å and 300 Å, but is not limited thereto.

Figure 2A:
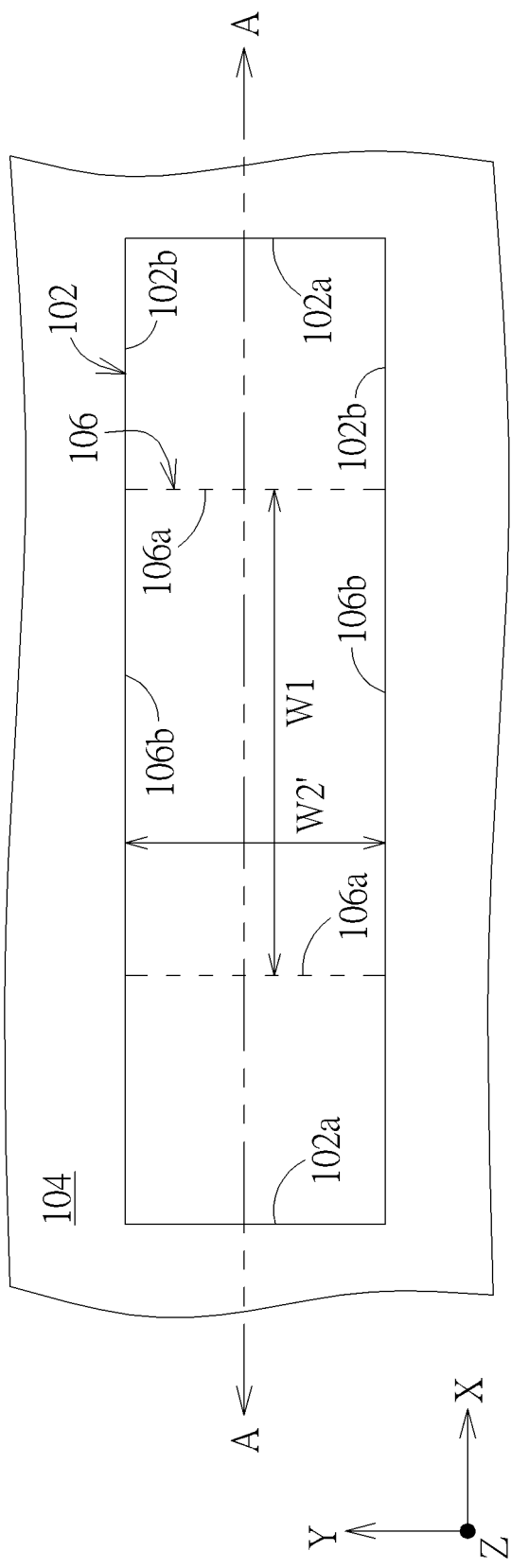
Figure 2B:
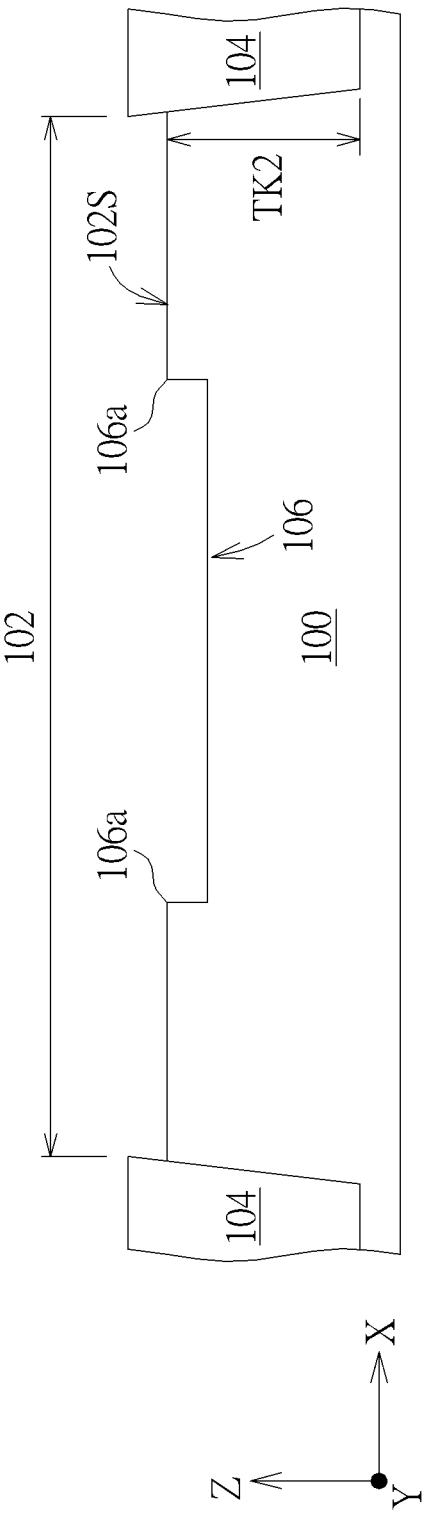

Please refer to FIG. 2A and FIG. 2B. Following, a shallow trench isolation structure 104 and an active region 102 surrounded by the shallow trench isolation structure 104 are formed in the substrate 100. The method for forming the shallow trench isolation structure 104 and the active region 102 may include the following steps. First, another patterning process (another photolithography-etching process) may be performed to form an isolation trench (not shown) in the substrate 100 to define an active region 102 in the substrate 100. Subsequently, a deposition process (such as a chemical vapor deposition process) may be performed to form a dielectric material (such as silicon oxide) on the substrate 100 to fill the isolation trench. After that, a planarization process (such as a chemical mechanical polishing process) may be performed to remove the dielectric material outside the isolation trench, and the dielectric material filling in the isolation trench forms a shallow trench isolation structure 104 that surrounds the active region 102. The shallow trench isolation structure 104 may have a depth TK2 in the Z direction (the depth below the surface 102s of the active region 102). According to an embodiment of the present invention, the depth TK2 may be between about 2500 Å and 3500 Å, but is not limited thereto.

A portion of the recessed region 106 is included in the active region 102 and is approximately located in the region of the active region 102 where a device channel of the semiconductor device is to be formed. According to an embodiment of the present invention, the recessed region 106 is approximately located in the middle portion of the active region 102. It is noteworthy that since the recessed region 106 is formed in the substrate 100 prior to the formation of the shallow trench isolation structure 104 and the active region 102, the portions of the recessed region 106 outside the active region 102 may be obliterated by the shallow trench isolation structure 104. As a result, as shown in FIG. 2A, the width W2 (shown in FIG. 1A) of the recessed region 106 in the Y direction may be reduced to be the same as the width W2' of the active region 102. Both of the two edges 106b of the recessed region 106 that extend along the X direction may border the shallow trench isolation structure 104 and flush with the two edges 102b of the active region 102, respectively. The other two edges 106a of the recessed region 106 that extend along the Y direction are located within the active region 102, and are separated from the edges 102a of the active region 102 by a distance and do not border the shallow trench isolation structure 104.

Figure 3A:
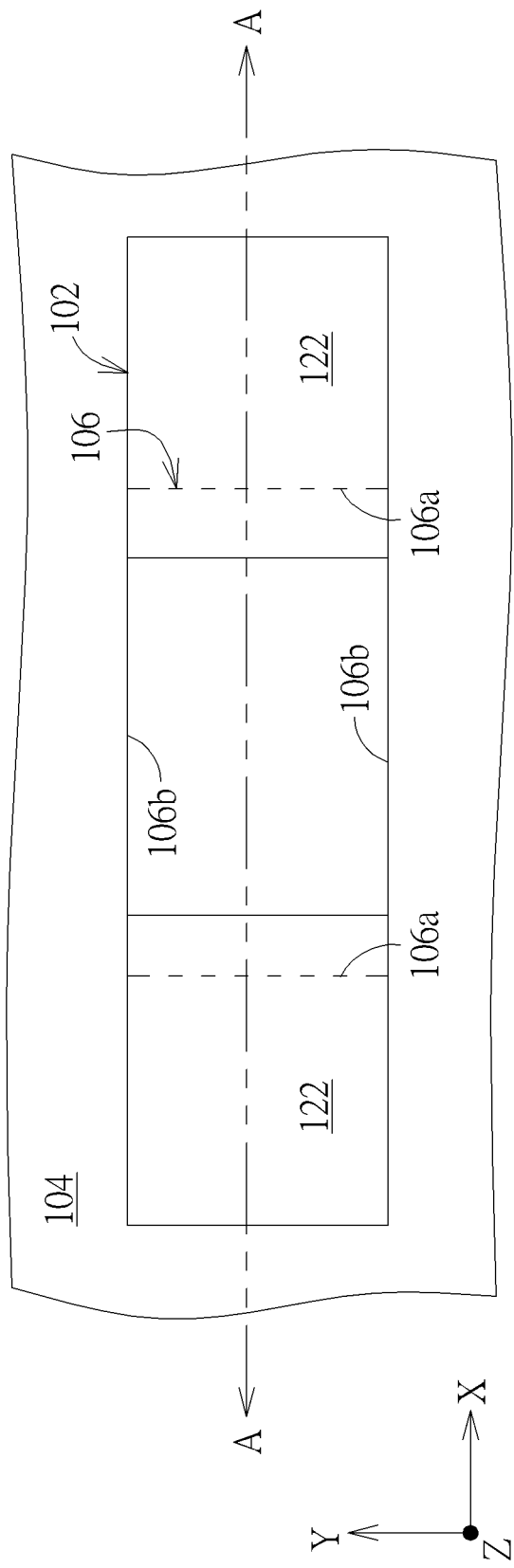
Figure 3B:
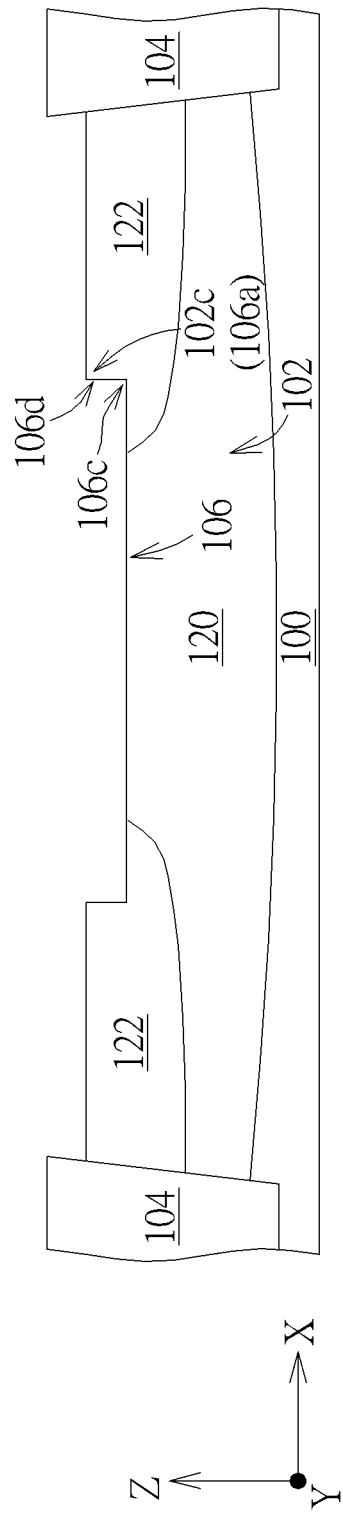

Please refer to FIG. 3A and FIG. 3B. Subsequently, successive ion implantation processes may be performed to implant suitable dopants into the substrate 100 to form a well region 120 and lightly-doped regions 122 in pre-determined regions of the active region 102. As shown in FIG. 3B, the well region 120 may extend laterally throughout the active region 102 and encompass the recessed region 106. The lightly-doped regions 122 are formed in the active region 102 (in the well region 120) at two sides of the recessed region 106 and cover the bottom corners 106c and sidewalls 106d of the recessed region 106 and the top corners 102c of the active region 102 (only the bottom corner 106c, the sidewall 106d, and the top corner 102c at the right side of the recessed region 106 are labeled in FIG. 3B for the sake of simplicity). It should be noted that the top corners 102c of the active region 102 shown in FIG. 3B correspond to the edges 106a of the recessed region 106 shown in FIG. 3A. According to an embodiment of the present invention, the well region 120 and the lightly-doped regions 122 may have complementary conductivity types. For example, the well region 120 may have P-type conductivity type, and the lightly-doped regions 122 may have N-type conductivity type. In other examples, the well region 120 may have N-type conductivity type, and the lightly-doped regions 122 may have P-type conductivity type.

Please refer to FIG. 4A and FIG. 4B. Following, an oxidation process P1 and a deposition process P2 may be successively performed to form a gate dielectric layer 130 on the substrate 100. According to an embodiment of the present invention, the oxidation process P1 may be an in-situ steam generation (ISSG) oxidation process that may grow a substrate oxide layer 131 along the surface of the active region 102 and conformally covering the recessed region 106. The deposition process P2 may be an atomic layer deposition (ALD) process that forms a deposition dielectric layer 132 on the substrate oxide layer 131 and covering the active region 102 and the shallow trench isolation structure 104 in a blanket manner. As shown in FIG. 4B, the gate dielectric layer 130 has a dual-layered structure formed by the substrate oxide layer 131 and the deposition dielectric layer 132, wherein the substrate oxide layer 131 (formed by oxidation process P1) directly contacts the substrate 100, and the deposition dielectric layer 132 (formed by deposition process P2) is separated from the substrate 100 by the substrate oxide layer 131 and not in direct contact with the substrate 100. According to an embodiment of the present invention, the substrate oxide layer 131 and the deposition dielectric layer 132 may include a same dielectric material, such as silicon oxide. In other embodiments of the present invention, the substrate oxide layer 131 and the deposition dielectric layer 132 may include different dielectric materials. For example, the substrate oxide layer 131 may include silicon oxide and the deposition dielectric layer 132 may include a high-k dielectric material.

The overall thickness of the gate dielectric layer 130 may be adjusted according to design needs. According to an embodiment of the present invention, the thickness of the gate dielectric layer 130 may be between about 200 Å and 300 Å, but is not limited thereto.

The proportion of the thicknesses of the substrate oxide layer 131 and the deposition dielectric layer 132 of the gate dielectric layer 130 may also be adjusted according to design needs. According to an embodiment of the present invention, the thickness of the substrate oxide layer 131 may be about 1 to 2.5 times of the thickness of the deposition dielectric layer 132. For example, in an embodiment, the gate dielectric layer 130 is about 200 Å, the substrate oxide layer 131 is about 140 Å, and the deposition dielectric layer 132 is about 60 Å, but is not limited thereto.

In some embodiments of the present invention, the gate dielectric layer 130 may have a single-layered structure entirely formed by the substrate oxide layer 131. In this case, the gate dielectric layer 130 may be formed by performing the oxidation process P1 to grow the substrate oxide layer 131 till the gate dielectric layer 130 have the pre-determined thickness of the gate dielectric layer 130, and the deposition process P2 may be omitted.

It is noteworthy that, by performing the oxidation process P1 to oxidize the material of the substrate 100 to grow the substrate oxide layer 131, after the oxidation process P1, as shown in FIG. 4B, the width W1 (shown in FIG. 2A) of the recessed region 106 in the X direction may be expanded to be a wider width W1' since a portion of the material of the substrate 100 is consumed during the oxidation process P1. The difference between the width W1 and the width W1' is determined by the amount of the substrate 100 being consumed during the oxidation process P1. According to an embodiment of the present invention, the width W1' may be larger than the width W1 by about 50 Å to 150 Å, but is not limited thereto. It is also noteworthy that, the bottom corners 106c of the recessed region 106 and the top corners 102c of the active region 102 may be rounded by the oxidation process P1, and therefore the sidewalls 106d may incline toward the outer side of the recessed region 106. Overall speaking, the profile of the edge portion of the recessed region 106 may be rounded after the oxidation process P1.

Figure 5A:
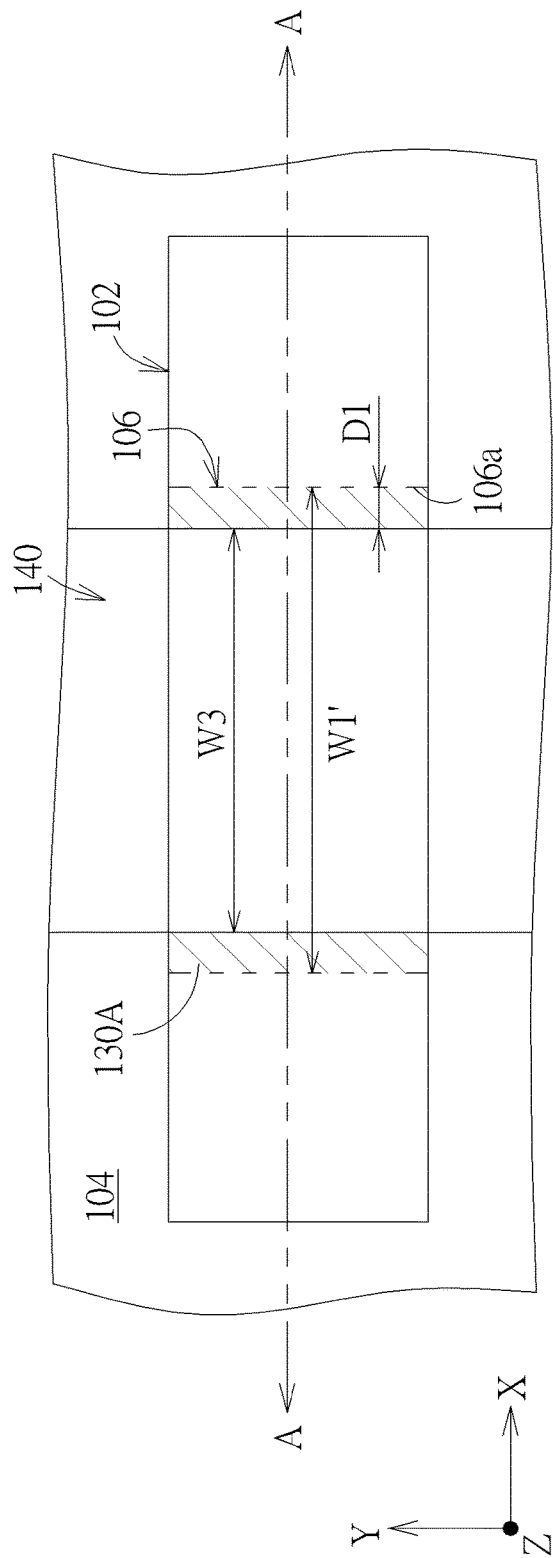
Figure 5B:
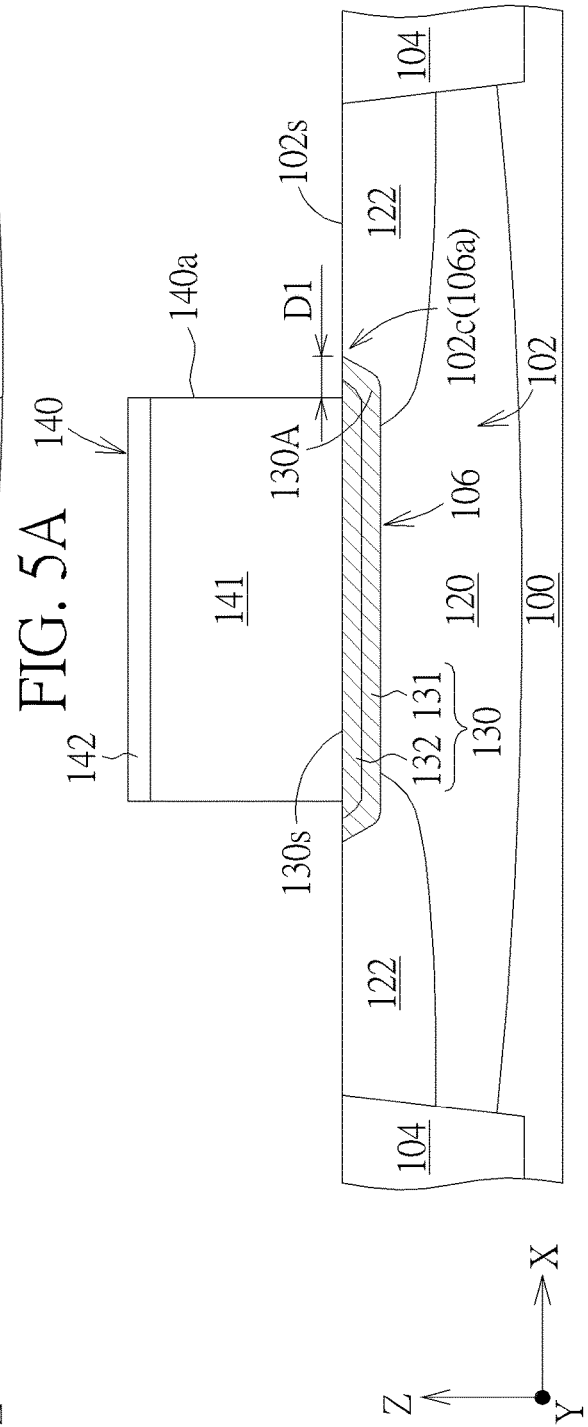

Please refer to FIG. 5A and FIG. 5B. Subsequently, a gate material layer (not shown) may be formed on the gate dielectric layer 130, and a patterning process (such as a photolithography-etching process) is then performed to remove unnecessary portions of the gate material layer to form a gate structure 140. The gate structure 140 is disposed on the gate dielectric layer 130 and extends along the Y direction to cross over the active region 102 and partially overlaps the shallow trench isolation structure 104. The gate structure 140 and the active region 102 (the substrate 100) are separated by the gate dielectric layer 130 and are not in direct contact with each other. According to an embodiment of the present invention, the gate structure 140 may include a polysilicon layer 141 and a hard mask layer 142 on the polysilicon layer 141. The gate structure 140 may be a dummy gate that is used in later replacement metal gate (RMG) process to form a metal gate structure.

The gate dielectric layer 130 outside the recessed region 106 may be etched and removed to expose the 102s of the active region 102 during the process of forming the gate structure 140. According to an embodiment of the present invention, the surface 130s of the gate dielectric layer 130 covered by the gate structure 140 may be flush with the surface 102s of the active region 102.

The width W3 of the gate structure 140 may be equal to or smaller than the width W1' of the recessed region 106. In a case where the width W3 is smaller than the width W1', as shown in FIG. 5A and FIG. 5B, the edge portions 130A of the gate dielectric layer 130 may be exposed form two sides of the gate structure 140 (only one edge portion 130A is labeled in FIG. 5A and FIG. 5B for the sake of simplicity). The edge portion 130A at one side of the gate structure 140 may overhang from a sidewall 140a of the gate structure 140 by a distance D1. The distance D1 is also the distance from the sidewall 140a of the gate structure 140 to the edge 106a of the recessed region 106. In another case where the width W3 of the gate structure 140 is approximately equal to the width W1' of the recessed region 106, the sidewall 140a of the gate structure 140 may be approximately aligned with the edge 106a of the recessed region 106, and the distance D1 is approximately 0 Å. According to an embodiment of the present invention, the distance D1 may be about 0 Å to 250 Å, but is not limited thereto. As shown in FIG. 5B, the gate structure 140 and the lightly-doped regions 122 may partially overlap in the Z direction (the vertical direction).

Please refer to FIG. 6A and FIG. 6B. Subsequently, a pair of spacers 150 may be formed on sidewalls 140a of the gate structure 140, and source/drain regions 124 are formed at two sides of the gate structure 140 and adjacent to the spacers 150. The spacers 150 and the source/drain regions 124 may be formed by the following steps. First, a spacer material layer (not shown) may be formed in a blanket manner to cover the substrate 100 and the gate structure 140. Subsequently, an anisotropic etching process may be performed to etch and remove unnecessary portions of the spacer material layer on the substrate 100 and on the top surface of the gate structure 140, thereby forming spacers 150 self-aligned to sidewalls 140a of the gate structure 140. After forming the spacers 150, an ion implantation process may be performed, using the gate structure 140 and the spacers 150 as an implant mask to implant suitable dopants into the active region 102 at two sides of the gate structure 140 to form the source/drain regions 124.

As shown in FIG. 6B, the source/drain regions 124 are located in the lightly-doped regions 122. The source/drain regions 124 are separated from the well region 120 and are not in direct contact with the well region 120 by being surrounded by the source/drain regions 124. The source/drain regions 124 and the lightly-doped regions 122 may have a same conductivity type. Due to diffusion of the dopants, the source/drain regions 124 may extend laterally to be directly under the spacers 150 and directly contact the edge portions 130A of the gate dielectric layer 130.

According to an embodiment of the present invention, the spacers 150 may respectively have a multi-layered structure including a first spacer layer 151 with an L-shaped cross-sectional profile and a second spacer layer 152 disposed on the first spacer layer 151. The first spacer layer 151 and the second spacer layer 152 may include dielectric materials such as silicon oxide, silicon nitride, silicon oxynitride, silicon carbide, nitride doped silicon carbide, or a combination thereof, but are not limited thereto. As shown in FIG. 6A and FIG. 6B, the spacer 150 at a side of the gate structure 140 may include a width W4 in the X direction, and the width W4 may be controlled by the thickness of the spacer material layer (not shown) and the lateral etching rate of the anisotropic etching process for forming the spacers 150. According to an embodiment of the present invention, as shown in FIG. 6B, the width W4 of the spacer 150 may be larger than the overhang distance D1 of the edge portion 130A of the gate dielectric layer 130, so that the spacer 150 may extend across the edge 106a (or the top corner 102c of the active region 102) of the recessed region 106 and partially overlaps the gate dielectric layer 130 and the active region 102 at the same time. According to an embodiment of the present invention, the width W4 of the spacer 150 may be between about 150 Å and 250 Å, but is not limited thereto.

Figure 7:
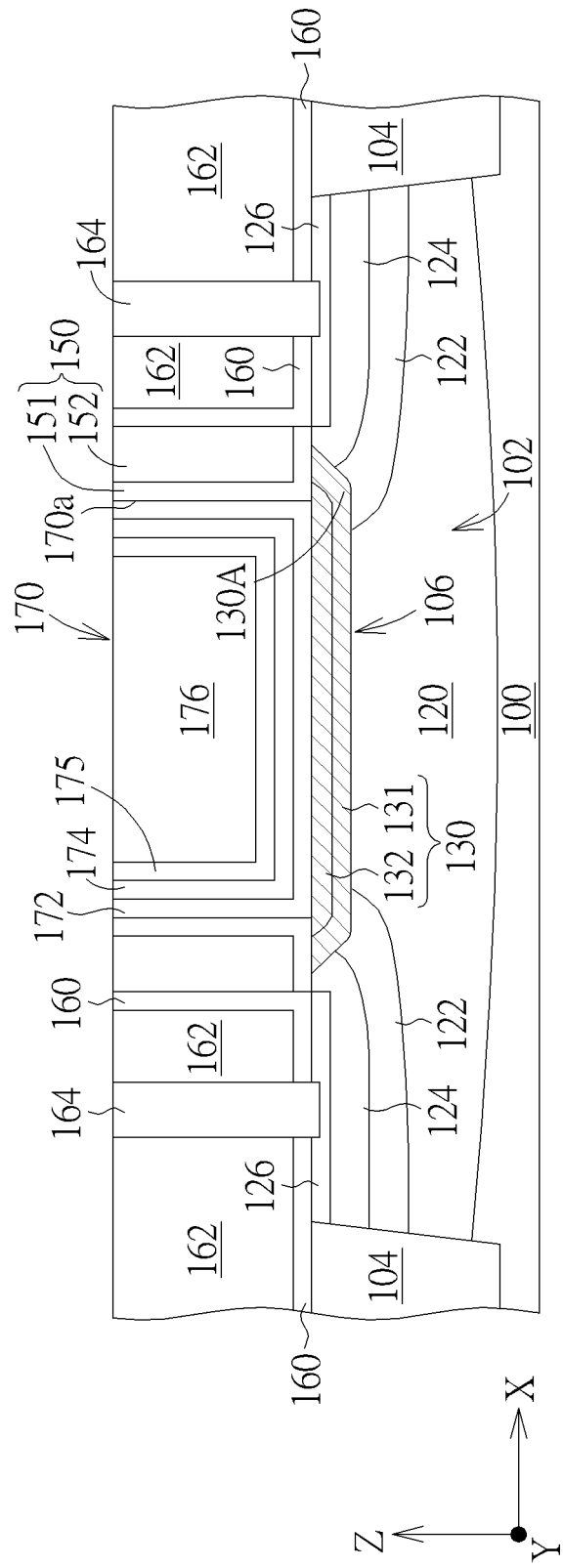
Figure 8:
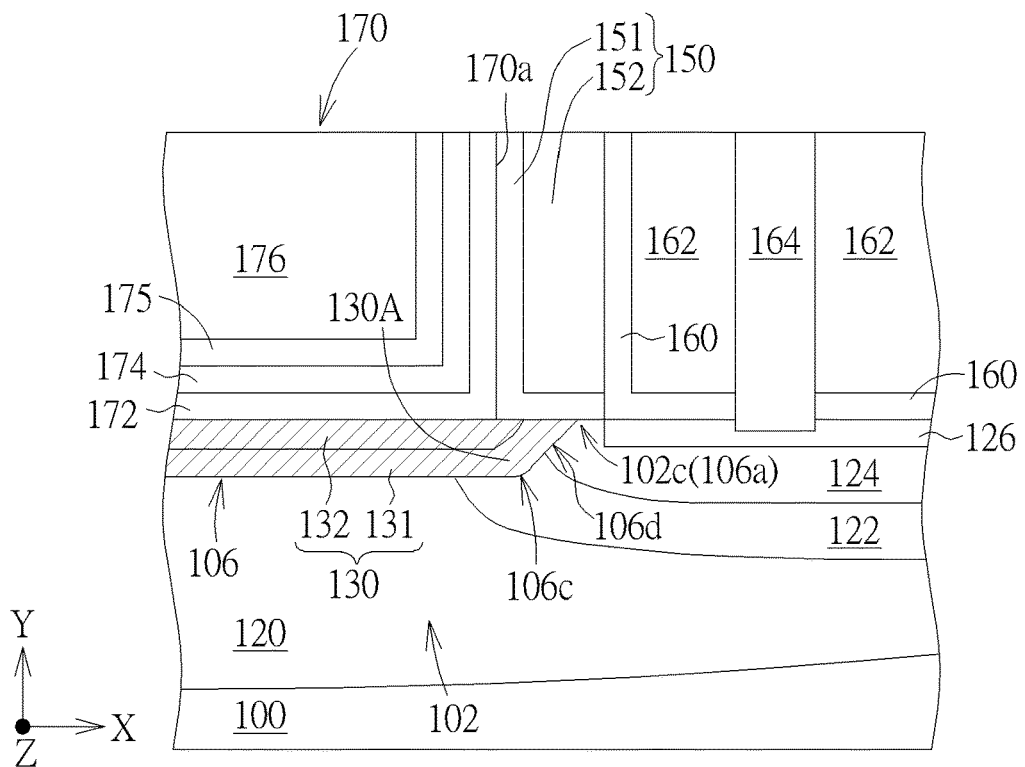

Please refer to FIG. 7. Subsequently, a self-aligned silicide process may be performed to form silicide layers 126 in the source/drain regions 124. The silicide layers 126 may include cobalt silicide (CoSi), titanium silicide (TiSi), nickel silicide (NiSi), or platinum silicide (PtSi), but is not limited thereto. Following, an etching stop layer 160 and an interlayer dielectric layer 162 are then formed to cover the substrate 100 and gate structure 140 in a blanket manner. A planarization process (such as a chemical mechanical polishing process) may be performed to remove portions of the interlayer dielectric layer 162 and the etching stop layer 160 until the top surface of the gate structure 140 is exposed. Following, a replacement metal gate (RMG) process is performed to replace the gate structure 140 with a metal gate structure 170. Contact plugs 164 may be formed in the interlayer dielectric layer 162 at two sides of the metal gate structure 170 and through the etching stop layer 160 to directly and electrically contact the silicide layers 126 in the source/drain regions 124. According to an embodiment of the present invention, the material of the etching stop layer 160 may include silicon nitride, silicon oxynitride, silicon carbide, or nitride doped silicon carbide, but is not limited thereto. The material of the interlayer dielectric layer 162 may include silicon oxide, but is not limited thereto. The material of contact plugs 164 may include tungsten (W), copper (Cu), aluminum (Al), titanium (Ti), titanium nitride (TIN), tantalum (Ta), tantalum nitride (TaN), or a combination thereof, but it is not limited thereto.

In detail, as shown in FIG. 7, the metal gate structure 170 may include a U-shaped work function metal layer 174, a U-shaped barrier layer 175 on the work function metal layer 174, and a low-resistance metal layer 176 on the barrier layer 175. In an case where the semiconductor device shown in FIG. 7 is to form an N-type transistor, the work function metal layer 174 may have a work function ranging between 3.9 eV and 4.3 eV and may include titanium aluminide (TiAl), zirconium aluminide (ZrAl), tungsten aluminide (WAl), tantalum aluminide (TaAl), hafnium aluminide (HfAl), titanium aluminum carbide (TiAlC), or a combination thereof, but it is not limited thereto. In another case where the semiconductor device shown in FIG. 7 is to form a P-type transistor, the work function metal layer 174 may have a work function ranging between 4.8 eV and 5.2 eV and may include titanium nitride (TiN), tantalum nitride (TaN), tantalum carbide (TaC), or a combination thereof, but it is not limited thereto. The material of the barrier layer 175 may include titanium (Ti), titanium nitride (TiN), tantalum (Ta), tantalum nitride (TaN), or a combination thereof, but is not limited thereto. The material of the low-resistance metal layer 176 may include tungsten (W), copper (Cu), aluminum (Al), titanium aluminum (TiAl), cobalt tungsten phosphide (CoWP), or a combination thereof, but is not limited thereto. The gate structure 170 may further include a high-k dielectric layer as design needs require. For example, as shown in FIG. 7, a U-shaped high-k dielectric layer 172 may be disposed between the work function metal layer 174, the spacers 150 and the gate dielectric layer 130, so that the work function metal layer 174 is not in direct contact with the spacers 150 and the gate dielectric layer 130. In another embodiment of the present invention, a linear shaped high-k dielectric layer (not shown) may be disposed between the bottom surface of the work function metal layer 174 and the gate dielectric layer 130, so that the work function metal layer 174 may directly contact the spacers 150 while not in direct contact with the gate dielectric layer 130. It should be noted that, in some cases, the high-k dielectric layer 172 shown in FIG. 7 may be omitted and the work function metal layer 174 may be in direct contact with the spacers 150 and the gate dielectric layer 130.

Please refer to FIG. 7 and FIG. 8 at the same time. The semiconductor device provided by the present invention includes the substrate 100, the active region 102 defined in the substrate 100 by the shallow trench isolation structure 104, the recessed region 106 in the active region 102, the gate dielectric layer 130 on the recessed region 106, a gate structure such as the metal gate structure 170 disposed on the gate dielectric layer 130, and the source/drain regions 124 formed in the active region 102 at two sides of the metal gate structure 170. The semiconductor device further includes the well region 120 formed in the substrate 100 and encompassing the recessed region 106, and the lightly-doped regions 122 formed in the well region 120 at two sides of the recessed region 106 and encompassing the source/drain regions 124. The source/drain regions 124 are separated from the well region 120 by the lightly-doped regions 122 and are not in direct contact with the well region 120. The lightly-doped regions 122 and the metal gate structure 170 may partially overlap along the Z direction (the vertical direction). The portion of the active region 102 directly under the gate dielectric layer 130 may form a recessed channel of the semiconductor device. The recessed channel may be turned-on or turned-off by controlling the voltage applied to the metal gate structure 170. By using the recessed region 106 to form the recessed channel and using the oxidation process P1 (such as ISSG process) to form the gate dielectric layer 130, the bottom corners 106c and sidewalls 106d of the recessed region 106 and the top corners 102c of the active region 102 may be rounded after the oxidation process P1, so that the edge portions 130A of the gate dielectric layer 130 may accordingly have rounded profiles. In this way, the strength of the electric field near the edges of the metal gate structure 170 and the source/drain regions 124 may be reduced. Consequently, leakage current and/or device reliability problems caused by GIDL and the HCI may be improved.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 9:
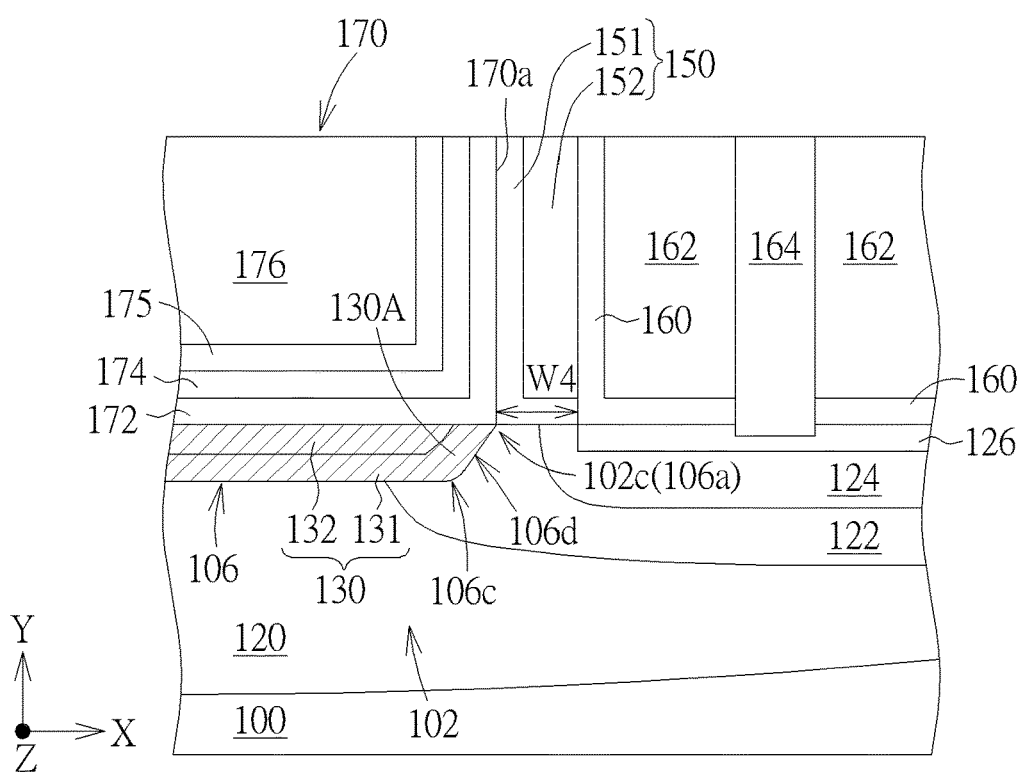
FIG. 9 is a partial enlarged cross-sectional view of a semiconductor device according to a second embodiment of the present invention.

Please refer to FIG. 9, which is a partial enlarged cross-sectional view of a semiconductor device according to a second embodiment of the present invention. Detailed manufacturing process and structure of the semiconductor device shown in FIG. 9 may be referred to the semiconductor device shown in FIG. 8, and will not illustrated herein for the sake of brevity. The semiconductor device shown in FIG. 9 is different from the semiconductor device shown in FIG. 8 in that, the overhang distance D1 (refer to FIG. 5A or FIG. 5B) of the edge portion 130A of the gate dielectric layer 130 may be reduced, so that the sidewall 170a of the metal gate structure 170 may be closer to the edge 106a of the recessed region 106, and the metal gate structure 170 may overlap vertically over the edge portion 130A of the gate dielectric layer 130. In some embodiments when the overhang distance D1 is reduced to be approximately 0, the sidewall 170a of the metal gate structure 170 may be approximately aligned with the edge 106a of the recessed region 106 in the Z direction (the vertical direction). In some embodiments, as shown in FIG. 9, due to the reduced distance D1 and the width W4 of the spacer 150, the laterally extending portion of the source/drain region 124 under the spacer 150 may be distanced from the edge portion 130A of the gate dielectric layer 130. The source/drain region 124 is separated from the edge portion 130A of the gate dielectric layer 130 by the lightly-doped region 122 and is not in direct contact with the edge portion 130A.

Figure 10:
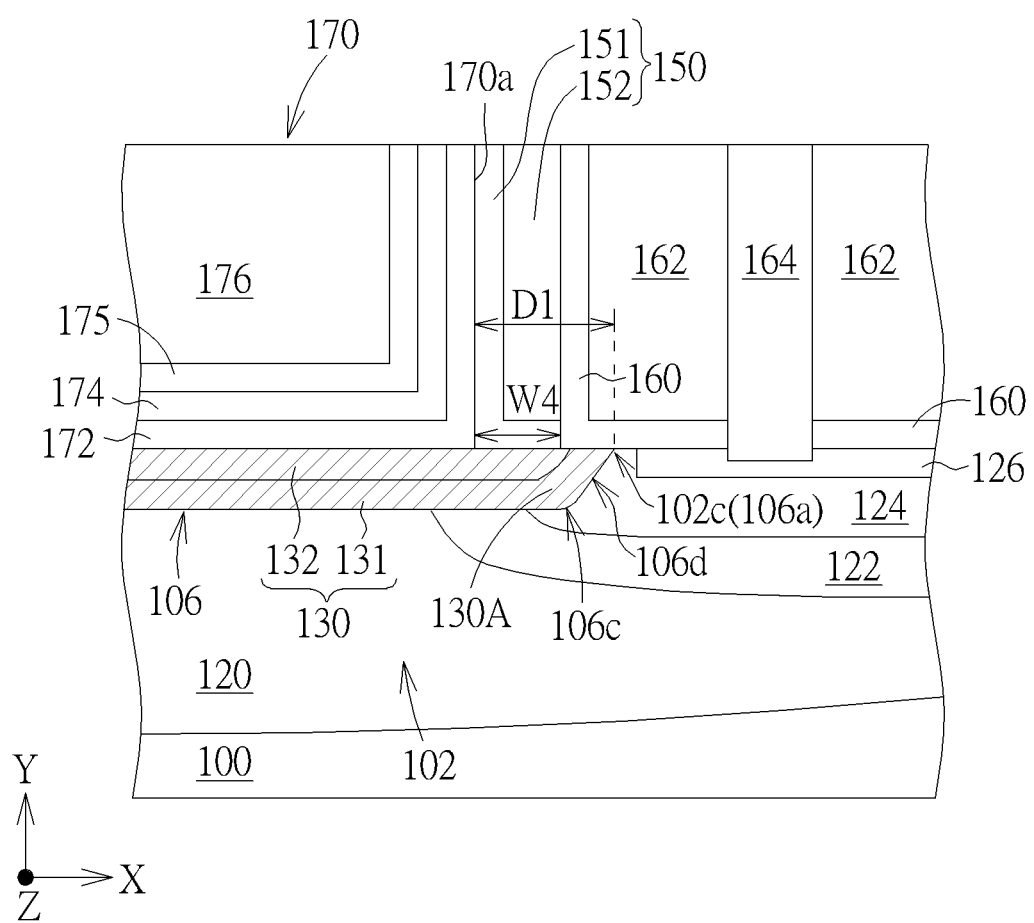
FIG. 10 is a partial enlarged cross-sectional view of a semiconductor device according to a third embodiment of the present invention.

Please refer to FIG. 10, which is a partial enlarged cross-sectional view of a semiconductor device according to a third embodiment of the present invention. Detailed manufacturing process and structure of the semiconductor device shown in FIG. 10 may be referred to the semiconductor device shown in FIG. 8, and will not illustrated herein for the sake of brevity. The semiconductor device shown in FIG. 10 is different from the semiconductor device shown in FIG. 8 in that, the overhang distance D1 (refer to FIG. 5A or FIG. 5B) of the edge portion 130A of the gate dielectric layer 130 may be increased, so that the sidewall 170a of the metal gate structure 170 may be farther from the edge 106a of the recessed region 106. When the width W4 of the spacer 150 is smaller than the distance D1, the spacer 150 may be completely on the edge portion 130A of the gate dielectric layer 130, and a portion of the edge portion 130A of the gate dielectric layer 130 may be exposed from the outer side of the spacer 150. The source/drain region 124 formed by self-aligning to the spacer 150 may completely encompass the edge portion 130A of the gate dielectric layer 130 (encompass the bottom corner 106c and sidewall 106d of the recessed region 106 and the top corner 102c of the active region 102. The etching stop layer 160 may extend across the edge 106a of the recessed region 106 and partially overlap the edge portion 130A of the gate dielectric layer 130 in the Z direction (the vertical direction).

Figure 11:
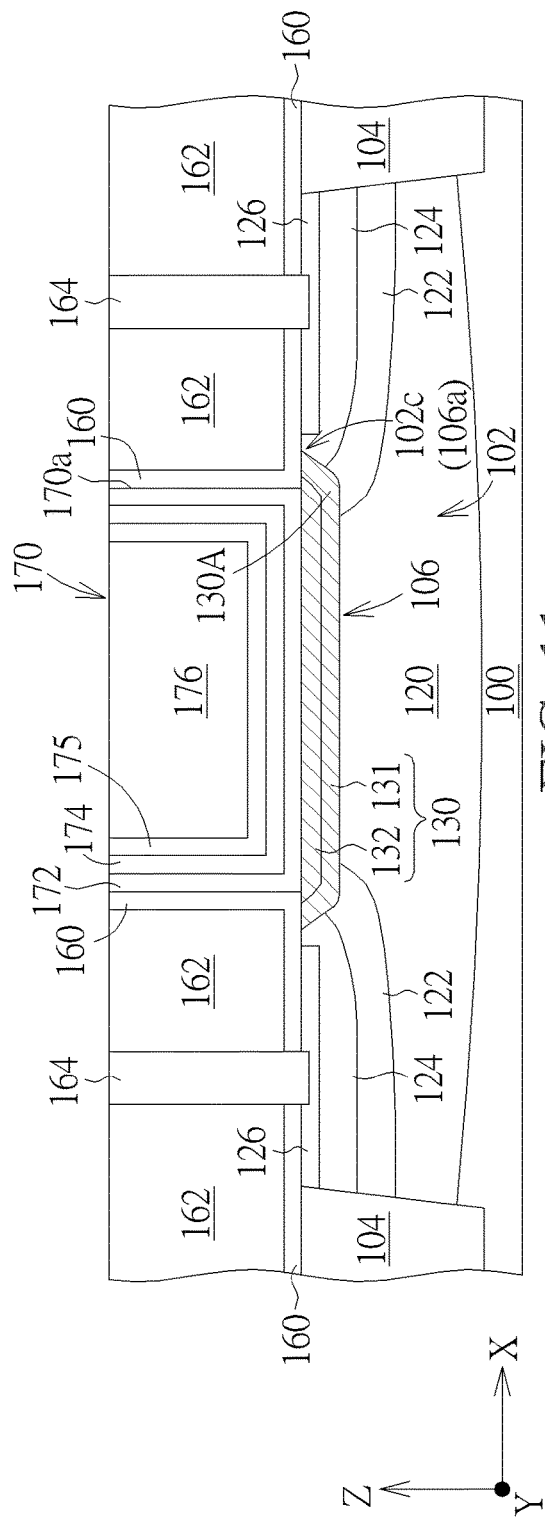
FIG. 11 is a cross-sectional view of a semiconductor device according to a fourth embodiment of the present invention.

Please refer to FIG. 11, which is a cross-sectional view of a semiconductor device according to a fourth embodiment of the present invention. Detailed manufacturing process and structure of the semiconductor device shown in FIG. 11 may be referred to the semiconductor device shown in FIG. 7, and will not illustrated herein for the sake of brevity. The semiconductor device shown in FIG. 11 is different from the semiconductor device shown in FIG. 7 in that, the spacer (the spacer 150 shown in FIG. 6B or FIG. 7) may be removed after forming the silicide layers 126. Accordingly, the lately formed etching stop layer 160 may extend across the edge 106a of the recessed region 106, directly contact the sidewall 170a of the metal gate structure 170, and partially overlap the edge portion 130A of the gate dielectric layer 130 in the Z direction (the vertical direction).

Figure 12:
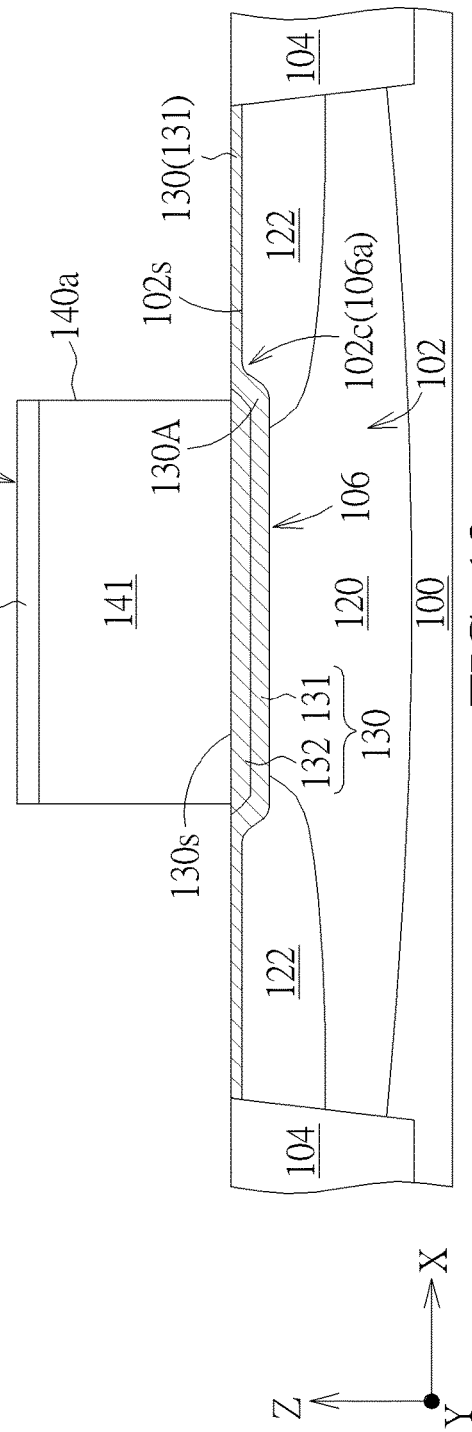
Figure 13:
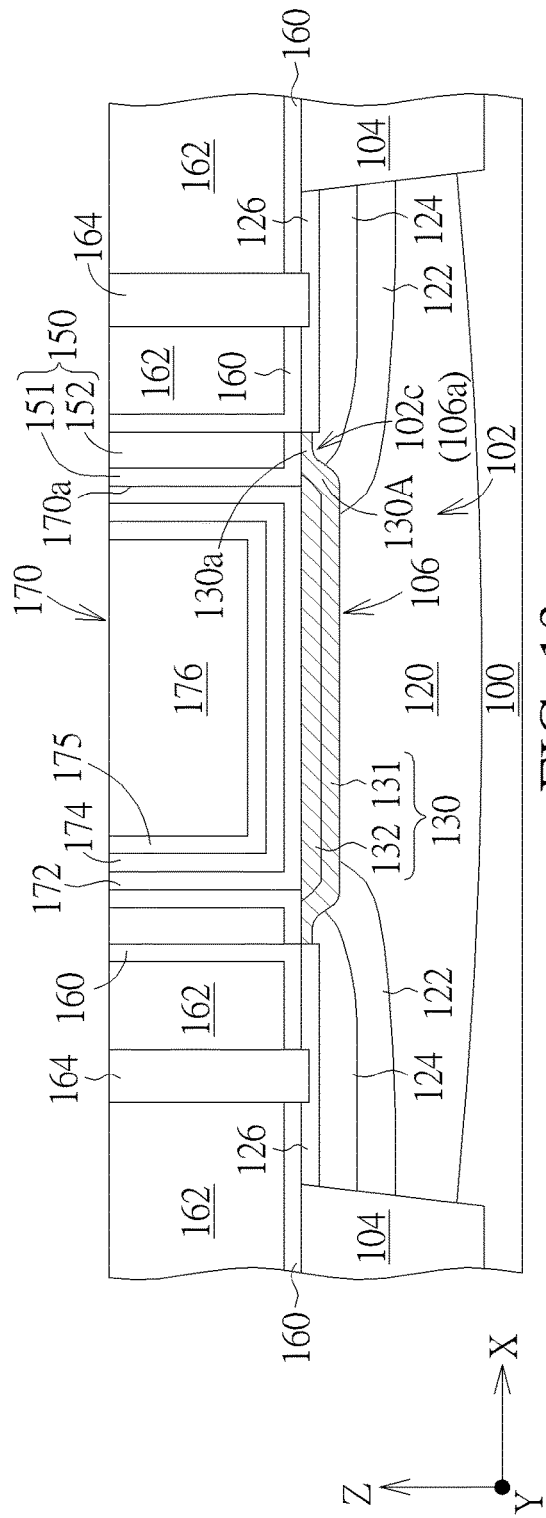

Please refer to FIG. 12 and FIG. 13, which are schematic diagrams illustrating a method for forming a semiconductor device according to a fifth embodiment of the present invention. FIG. 12 corresponds to the step shown in FIG. 5B, showing a cross-sectional view of the semiconductor device after forming a gate structure on the substrate. FIG. 13 corresponds to the step shown in FIG. 7, showing a cross-sectional view of the semiconductor device after forming a metal gate structure and contact plugs on the substrate. Other manufacturing steps may be referred to previous illustration for forming the semiconductor device shown in FIG. 7, and will not be illustrated herein for the sake of brevity. As shown in FIG. 12, after forming the gate structure 140, a portion of the gate dielectric layer 130 (for example, a portion of the substrate oxide layer 131) may remain to cover the surface 102s of the active region 102 exposed from the gate structure 140. The remained gate dielectric layer 130 may serve as a screen oxide to protect the surface 102s of the substrate 102 from damage during subsequent manufacturing processes. The remained gate dielectric layer 130 may also prevent the dopant channeling effect during the ion implantation processes, which is beneficial for obtaining source/drain regions 124 with ultra-shallow junctions. Afterword, as shown in FIG. 13, the source/drain regions 124, the silicide layers 126, the etching stop layer 160, the interlayer dielectric layer 162, and the contact plugs 164 are formed. It is noteworthy that the edge portion 130A of the gate dielectric layer 130 may include a lateral extending portion 130a disposed between the bottom of the spacer 150 and the source/drain region 124 and covering the top corner 102c of the active region 102.

Figure 14:
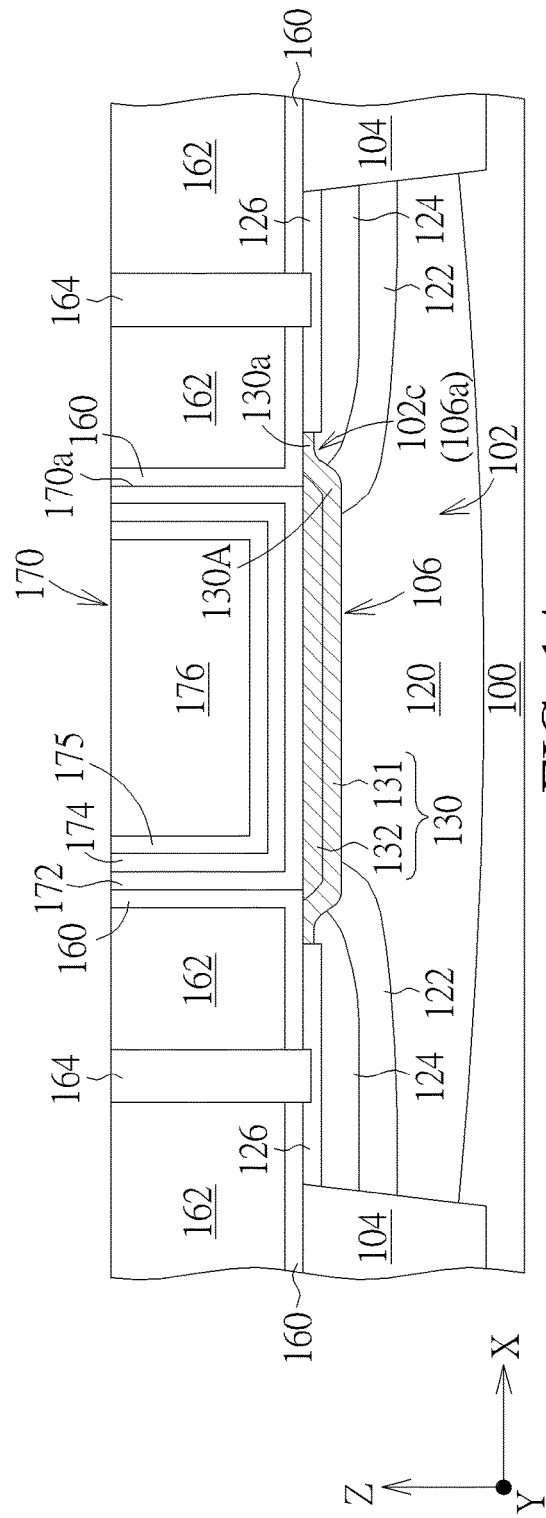
FIG. 14 is a schematic cross-sectional view of a semiconductor device according to a sixth embodiment of the present invention.

Please refer to FIG. 14, which is a schematic cross-sectional view of a semiconductor device according to a sixth embodiment of the present invention. Detailed manufacturing process and structure of the semiconductor device shown in FIG. 14 may be referred to the semiconductor device shown in FIG. 13, and will not illustrated herein for the sake of brevity. A difference between the semiconductor device shown in FIG. 14 and the semiconductor device shown in FIG. 13 is that, the spacer (the spacer 150 shown in FIG. 13) may be removed after forming the silicide layers 126. Accordingly, the lately formed etching stop layer 160 may extend across the edge 106a of the recessed region 106, directly contact the sidewall 170a of the metal gate structure 170, and partially overlap the edge portion 130A of the gate dielectric layer 130 in the Z direction (the vertical direction).

Figure 15:
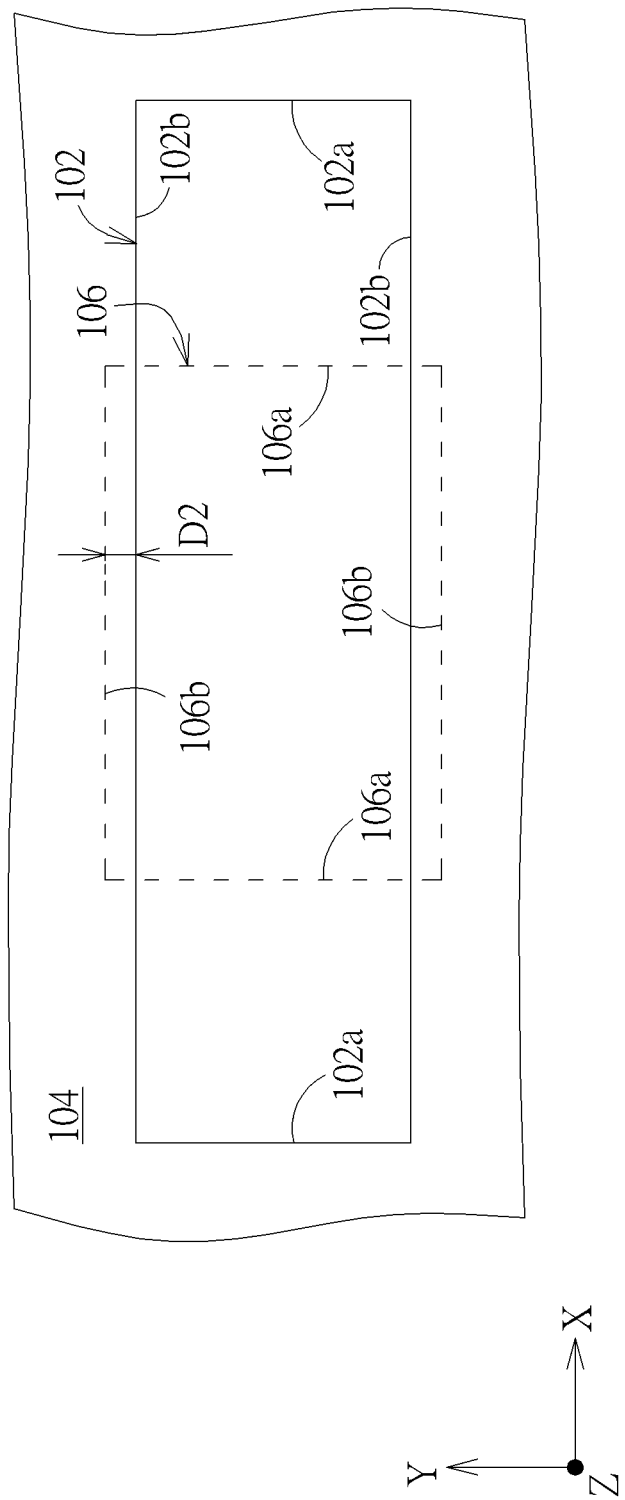
FIG. 15 is a schematic plan view of a semiconductor device after forming an active region, a shallow trench isolation structure and a recessed region in a substrate according to a seventh embodiment of the present invention.

Please refer to FIG. 15, which is a schematic plan view of a semiconductor device after forming an active region 102, a shallow trench isolation structure 104 and a recessed region in a substrate according to a seventh embodiment of the present invention. The embodiment shown in FIG. 15 is different from the embodiment shown in FIG. 2A in that, the recessed region 106 may be formed after the formation of the shallow trench isolation structure 104 and the active region 102. Accordingly, the pattern of the recessed region 106 may be transferred to the active region 102 and the shallow trench isolation structure 104 at the same time. As shown in FIG. 15, the pattern of the recessed region 106 may extend through the active region 102 along the Y direction and partially overlap the shallow trench isolation structure 104. The edges 106b of the recessed region 106 are located in the shallow trench isolation structure 104 and are distanced from the edges 102b of the active region 102 by a distance D2. According to an embodiment of the present invention, the distance D2 may be about 0 Å to 250 Å, but is not limited thereto.

In summary, the semiconductor devices and manufacturing method for forming the same provided by the embodiments of the present invention are featured for having a recessed channel and a gate dielectric layer with an edge portion having a rounded profile. An oxidation process (such as ISSG process) may be performed to simultaneously grow the gate dielectric layer and round the bottom corner of the recessed region, so that the edge portion of the obtained gate dielectric layer may have the rounded bottom corner and sidewall profile as the recessed region. In this way, the strength of the electric field near the edge portion of the gate dielectric layer and the source/drain region may be reduced. Therefore, the GIDL caused by band-to-band tunneling may be reduced. The present invention may also improve the reliability problems caused by HCI.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   an active region in the substrate;
   a recessed region in the active region;
   a gate dielectric layer deposited on the substrate in the recessed region, wherein an edge portion of the gate dielectric layer comprises a rounded profile;
   a gate structure on the gate dielectric layer, wherein in a plan view, an overlapping region of the active region and the gate structure is smaller than and completely overlapped with the recessed region; and
   a source/drain region in the active region and at a side of the gate structure, wherein the source/drain region directly contacts the edge portion of the gate dielectric layer.

2. The semiconductor device according to claim 1, wherein a depth of the recessed region is between 200 Å and 300 Å.

3. The semiconductor device according to claim 1, further comprising a shallow trench isolation structure surrounding the active region.

4. The semiconductor device according to claim 3, wherein an edge of the recessed region is flush with an edge of the shallow trench isolation structure.

5. The semiconductor device according to claim 3, wherein the recessed region and the shallow trench isolation structure are partially overlapped.

6. The semiconductor device according to claim 1, further comprising:
   a well region in the active region and encompassing the recessed region; and
   a lightly-doped region in the well region and encompassing the source/drain region.

7. The semiconductor device according to claim 1, wherein the gate dielectric layer comprises:
   a substrate oxide layer directly on the substrate; and
   a deposition dielectric layer on the substrate oxide layer.

8. The semiconductor device according to claim 7, wherein a top surface of the deposition dielectric layer is flush with a surface of the substrate.

9. The semiconductor device according to claim 1, further comprising a spacer on a sidewall of the gate structure and extending across an edge of the recessed region.

10. The semiconductor device according to claim 1, wherein the gate structure comprises a metal gate structure.

11. A method for forming a semiconductor device, comprising:
    providing a substrate;
    forming an active region in the substrate and a recessed region in the active region;
    performing an oxidation process to form a gate dielectric layer on the substrate in the recessed region, wherein an edge portion of the gate dielectric layer comprises a rounded profile;
    forming a gate structure on the gate dielectric layer, wherein in a plan view, an overlapping region of the active region and the gate structure is smaller than and completely overlapped with the recessed region; and
    forming a source/drain region in the active region and at a side of the gate structure, wherein the source/drain region directly contacts the edge portion of the gate dielectric layer.

12. The method for forming a semiconductor device according to claim 11, wherein a depth of the recessed region is between 200 Å and 300 Å.

13. The method for forming a semiconductor device according to claim 11, wherein the step of forming the active region comprises:
    forming the recessed region in the substrate; and
    after forming the recessed region, forming a shallow trench isolation structure in the substrate to define the active region in the substrate.

14. The method for forming a semiconductor device according to claim 11, wherein the step of forming the active region comprises:
    forming a shallow trench isolation structure in the substrate to define the active region in the substrate; and
    forming the recessed region in the active region and the shallow trench isolation structure.

15. The method for forming a semiconductor device according to claim 11, further comprising:
    forming a well region in the active region;
    forming a lightly-doped region in the well region and encompassing an edge of the recessed region; and
    after forming the lightly-doped region, performing the oxidation process.

16. The method for forming a semiconductor device according to claim 11, wherein the oxidation process comprises an in-situ steam generation (ISSG) oxidation process.

17. The method for forming a semiconductor device according to claim 11, wherein the step of forming the gate dielectric layer comprises:
    performing the oxidation process to form a substrate oxide layer; and
    performing a deposition process to form a deposition dielectric layer on the substrate oxide layer.

18. The method for forming a semiconductor device according to claim 17, wherein a top surface of the deposition dielectric layer is flush with a surface of the substrate.

19. The method for forming a semiconductor device according to claim 11, further comprising:
   forming a spacer on a sidewall of the gate structure, wherein the spacer extends across an edge of the recessed region; and
   after forming the spacer, forming the source/drain region in the active region.

20. The method for forming a semiconductor device according to claim 11, further comprising performing a replacement metal gate process to transfer the gate structure into a metal gate structure.

* * * * *